United States Patent
Zhang et al.

(10) Patent No.: US 8,477,462 B2
(45) Date of Patent: Jul. 2, 2013

(54) CPP DEVICE WITH IMPROVED CURRENT CONFINING STRUCTURE AND PROCESS

(71) Applicant: Headway Technologies, Inc., Milpitas, CA (US)

(72) Inventors: Kunliang Zhang, Fremont, CA (US); Min Li, Dublin, CA (US); Yue Liu, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 13/691,813

(22) Filed: Dec. 2, 2012

(65) Prior Publication Data

US 2013/0088797 A1    Apr. 11, 2013

Related U.S. Application Data

(62) Division of application No. 11/895,719, filed on Aug. 27, 2007, now Pat. No. 8,325,449.

(51) Int. Cl.
*G11B 5/33* (2006.01)
(52) U.S. Cl.
USPC ........................................ 360/324.1
(58) Field of Classification Search
None
See application file for complete search history.

(56) References Cited

U.S. PATENT DOCUMENTS

| | | | |
|---|---|---|---|
| 5,627,704 A | 5/1997 | Lederman et al. | |
| 5,668,688 A | 9/1997 | Dykes et al. | |
| 5,715,121 A | 2/1998 | Sakakima et al. | |
| 7,005,691 B2 | 2/2006 | Odagawa et al. | |
| 7,046,489 B2 | 5/2006 | Kamiguchi et al. | |
| 7,331,100 B2 | 2/2008 | Li et al. | |
| 7,476,414 B2 | 1/2009 | Fukuzawa et al. | |
| 7,538,987 B2 | 5/2009 | Fujiwara et al. | |
| 7,610,674 B2 * | 11/2009 | Zhang et al. | 29/603.14 |
| 7,872,838 B2 * | 1/2011 | Zhang et al. | 360/324.2 |
| 7,990,660 B2 * | 8/2011 | Zhang et al. | 360/324 |
| 2008/0192388 A1 * | 8/2008 | Zhang et al. | 360/324 |
| 2011/0117388 A1 * | 5/2011 | Zhang et al. | 428/811.2 |

OTHER PUBLICATIONS

"The scalability of CPP-GMR heads toward over 100Gbpsi, compared with TMR heads," by M. Takagishi et al., Toshiba, Enhanced GMR effect pf FeCo alloy CPP spin valve films, TMRC2001, Aug. 20, 2001, 10 pgs.

* cited by examiner

*Primary Examiner* — David D Davis
(74) *Attorney, Agent, or Firm* — Saile Ackerman LLC; Stephen B. Ackerman

(57) ABSTRACT

Plasma nitridation, in place of plasma oxidation, is used for the formation of a CCP layer. Al, Mg, Hf, etc. all form insulating nitrides under these conditions. Maintaining the structure at a temperature of at least 150° C. during plasma nitridation and/or performing post annealing at a temperature of 220° C. or higher, ensures that no copper nitride can form. Additionally, unintended oxidation by molecular oxygen of the exposed magnetic layers (mainly the pinned and free layers) is also avoided.

5 Claims, 2 Drawing Sheets

CPP DEVICE WITH IMPROVED CURRENT CONFINING STRUCTURE AND PROCESS

This is a divisional application of U.S. patent application Ser. No. 11/895,719, filed on Aug. 27, 2007, which is herein incorporated by reference in its entirety, and assigned to a common assignee.

This application is related to application Ser. No. 11/704,399, filed Feb. 9, 2007, herein incorporated, by reference, in its entirety.

FIELD OF THE INVENTION

The invention relates to the general field of CCP CPP GMR devices with particular reference to the composition and formation of the current confining layer.

BACKGROUND OF THE INVENTION

Current perpendicular to plane (CPP) giant magnetoresistance (GMR) based magnetic heads are considered as promising candidates for achieving a recording density of over 200 Gb/in$^2$ [1-2]. In a CPP GMR head structure a bottom synthetic spin valve type film stack is employed for biasing reasons, and a CoFe/NiFe composite free layer is conventionally used following the experience with Current in Plane (CIP) GMR devices. It has already been demonstrated [3] that by laminating CoFe AP1 layers with thin Cu, CPP GMR performance can be improved. An example of a metallic CPP spin valve structure is:

Seed/AFM/AP2/RU/[CoFeCu]/Cu30/[CoFe/NiFe]/cap

It has also been proposed [4] that CPP GMR performance will be further improved by a current confining path (CCP) in the Cu spacer achieved by providing a segregated metal path within an oxide. An example of a CCP-CPP spin valve structure is as follows:

Seed/AFM/AP2/RU/[CoFeCu]/Cu/CCP-layer/Cu/
[CoFe/NiFe]/cap

In a typical CPP spin valve structure of either case shown above, the AP1 or AP2 thickness is in the range of 20-50 Å, and the free layer thickness is in the range of 30-60 Å. For read head applications, the free layer is preferred to have a small coercivity (Hc) of less than 10 Oe and a low magnetostriction in the order of E-8 to low E-6 to reduce the stress-induced anisotropy.

For the past few years, there has been a lot of progress in the development of either metal CPP or CCP-CPP heads. However, for the metal CPP case, the CPP GMR ratio remains at a rather low value; for CCP-CPP schemes, since the current path is confined to Cu metal channels that are connected through an oxide matrix (AlOx, TiO$_2$, or MgO layers) [5], the Cu purity is easily compromised during the insulator formation process, making the latter critical to ensuring a high MR ratio. A schematic cross-section of a CCP layer is shown in FIG. 1. Conduction through copper layer 11 can be seen to continue upward through copper filaments 12 which are surrounded by insulating oxide regions 13. The present invention discloses a method and structure in which no degradation of the Cu purity and the MR ratio will occur.

[1] M. Lederman et al U.S. Pat. No. 5,627,704
[2] J. W. Dykes et al U.S. Pat. No. 5,668,688
[3] Toshiba TMRC 2001
[4] M. Li et al, US 2006/0007605

A routine search of the prior art was performed with the following references of interest being found:

In U.S. Pat. No. 7,005,691, Odagawa et al. show a non-magnetic copper film and an insulating film comprising an oxide, carbide, or nitride. In U.S. Patent Application 2005/0157433, Kamiguchi et al. show a resistance regulating layer in a copper non-magnetic layer comprising an oxide, nitride, fluoride, carbide, or boride.

U.S. Patent Application 2005/0094322 (Fukuzawa et al.) teaches plasma oxidation or nitridation of a metal non-magnetic layer. U.S. Patent Application 2005/0002126 (Fujiwara et al) says "instead of oxidation, nitridation may work if materials with different susceptibility to nitridation are chosen." However, this notion is not pursued any further, no detailed process or explanation being given. Additionally, the basic process underlying this invention is significantly different from the present invention. For example, the locations of the CCP layers and how to form them.

SUMMARY OF THE INVENTION

It has been an object of at least one embodiment of the present invention to provide a Confined Current Path structure in which the copper conducting filaments are free of oxygen contamination.

Another object of at least one embodiment of the present invention has been that said structure, when used in the context of a GMR or MTJ device, have associated magnetic layers, such as the pinned and free layers, that are free of oxygen contamination.

Still another object of at least one embodiment of the present invention has been to provide a process for forming said CCP structure.

A further object of at least one embodiment of the present invention has been that said process be easily adaptable for incorporation as part of processes currently in use for the manufacture of GMR and MTJ devices.

These objects have been achieved by the use of plasma nitridation, in place of plasma oxidation, for the formation of the CCP layer. Al, Mg, Hf, etc. all form insulating nitrides under these conditions. By maintaining the structure at a temperature of at least 150° C. during the plasma nitridation we ensure that no copper nitride can form. Additionally, unintended oxidation by molecular oxygen of the exposed magnetic layers (mainly the pinned and free layers) is also avoided. The net result is better dR/R and better overall performance.

DESCRIPTION OF THE PREFERRED EMBODIMENTS

In conventional CPP devices, a Cu spacer is used either as a full film layer for metal CPP or as a confined metal path in the CCP-CPP scheme. In the metal CPP case, since the resistance of Cu is very small, the CPP dR/R is shunted away to a small value. In the CCP-CPP case, the Cu metal path is formed and confined within an insulating template, typically AlOx or MgO, so that ARA can be enhanced quite significantly.

Insulator formation is generally accomplished using ion-assisted oxidation (IAO), such as plasma oxidation, radical oxidation, ozone oxidation or even natural oxidation. It is critical to preserve the copper purity during this step if one is to achieve the best possible MR ratio. Thus, the insulator formation process should result only in the formation of the insulator layer without oxidizing the Cu metal path or any other critical layers such as the free and AP1 (pinned reference) layers. In the prior art, during the oxidation of Al, Mg or the like materials, although Cu is more inert to oxidation than Al or Mg, it is inevitably oxidized to some extent during the energized oxidation process, especially when the Cu layer is very thin as it is for CCP-CPP scheme. This inevitably leads to undesirable Cu purity degradation and hence a lower dR/R.

Figure 1:
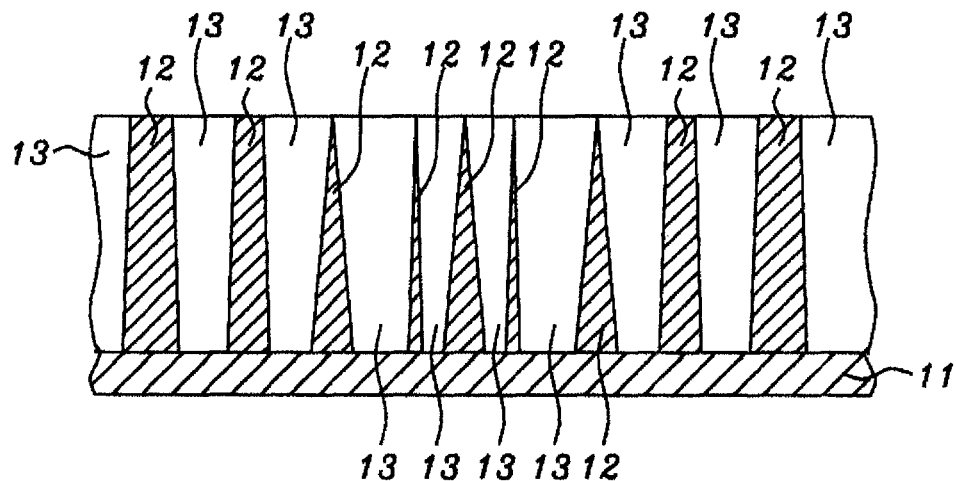
FIG. 1 illustrates a CCP layer of the prior art.
Figure 2:
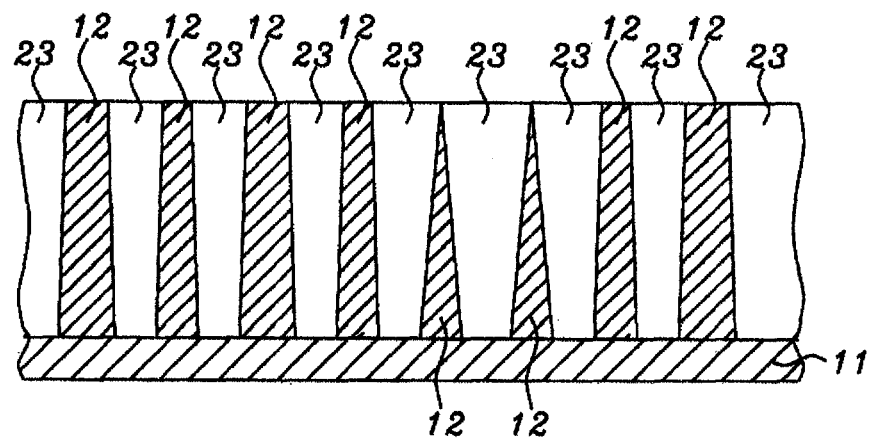
FIG. 2 shows a CCP layer according to the present invention wherein the copper filaments are embedded in a matrix of an insulating metallic nitride.

As illustrated in FIG. 2, the present invention overcomes this problem by forming the insulator material in which the copper filaments 12 are embedded from metallic nitride 23 rather than an oxide. It is well know that Cu is more inert than Al. However, in a plasma environment copper still reacts with ionized oxygen to form one or more of several possible copper oxides. This is because the oxygen is too active to selectively oxidize the Al but not the Cu, resulting in a net deterioration of the Cu purity. The stronger the oxidation process, the more the Cu layer gets oxidized and therefore the lower the dR/R.

Although nitrides of aluminum (and similar metals such as Hafnium or Magnesium) are readily formed using plasma nitridation, copper nitride is unstable and will dissociate, starting at temperatures as low as about 100° C., so that copper, even when exposed to active nitrogen, cannot be nitrided if it is at a temperature of about 150° C., or higher, when it is exposed to the nitriding environment. In fact, the purity of the copper will generally be further enhanced through the removal of surface copper oxide during the nitridation process.

Following current practice for magnetic head manufacturing, there is a post annealing treatment at a temperature of 220° C. or higher for a period of 2 hours or longer. So, even if some trace of CuN remains after the plasma nitridation, it will decompose to Cu during this post-annealing.

An additional benefit to the use of plasma nitridation in place of plasma oxidation is that the possibility of degrading the magnetic properties of the free layer and/or the AP1 layer is much less. During the plasma oxidation process excess (unactivated molecular) oxygen can be captured by the neighboring AP1 and free layer since these layers include iron which is an easy attractor to oxygen. On the other hand, when the plasma nitridation process is used, after the insulating layer is formed, the excess nitrogen will not affect other layers since nitrogen is inert outside the plasma environment.

Figure 3:
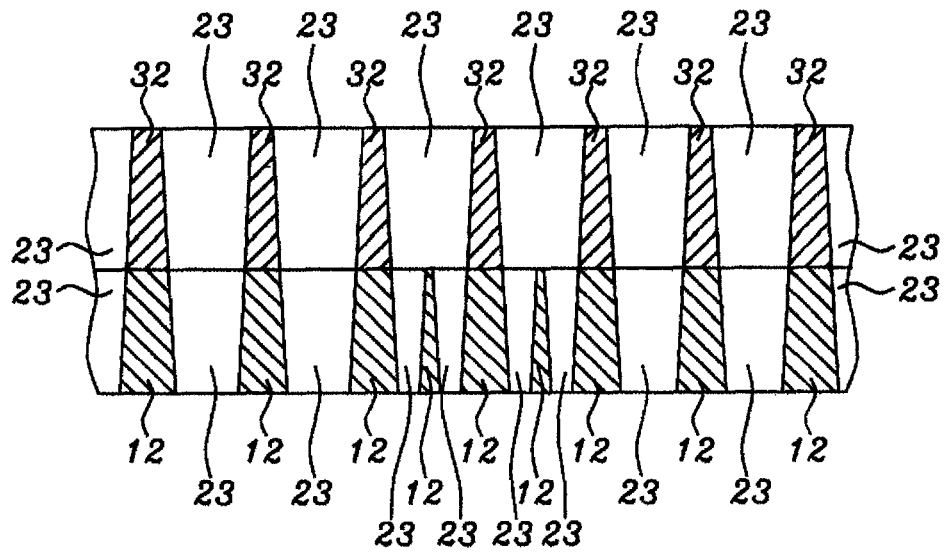
FIG. 3 shows how the structure of FIG. 2 may me repeated in order to increase the lengths of the copper filaments.

In order to increase the length of the copper filaments that make up a CCP layer, the process of laying down a copper layer, followed by a nitridable metallic layer and then repeating the plasma nitridation step may be repeated one or more times. The result, as schematically illustrated in FIG. 3, is the continuation of the original filaments 12 as filaments 32

Thus, with no changes to the preceding and succeeding steps, one can simply use plasma nitridation in place of the oxidation process. The resulting structure then looks as follows.

Seed/AFM/AP2/RU/[CoFe_Cu]/Cu/CCP-layer/Cu/
[CoFe/NiFe]/cap

In the above configuration, as in the prior art, a bottom electrode, Ta/Ru, is typically used as the seed layer and IrMn as the antiferromagnetic pinning layer.

Figure 4:
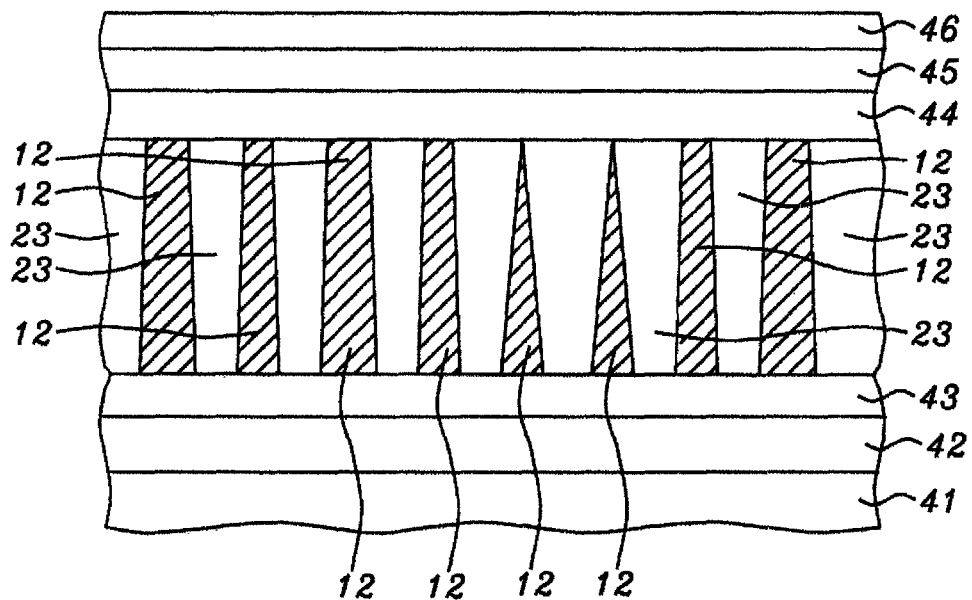
FIG. 4 illustrates the present invention as used as part of a GMR (or MTJ) device.

In the synthetic AP structure, FCC-like Fe10%Co/Fe70%Co/Fe10%Co is typically used as the AP2 while the Fe70%Co, laminated with Cu, is used as the AP1 (pinned reference) layer, shown as layer 42 in FIG. 4. In FIG. 4, element 41 represents all layers below AP1 (Ru, AP2, AFM, seed, etc.) while layer 43 is equivalent to layer 11 of FIG. 2. Layer 44 is the copper spacer layer portion of the GMR structure which would be replaced by a tunneling insulation layer if this were a Magnetic Tunnel Junction (MTJ) device. The free layer generally comprises CoFe/NiFe and Cu/Ru/Ta/Ru is applied as capping layer 45 onto which is deposited top electrode 46.

As disclosed in the present invention, the CCP layer is formed through plasma nitridation of Al, AlCu, Mg, AlMg, Hf, Ta, Cr, Ti, Si and Zr or the like. For example, Al, AlCu, Mg or AlMg (3~20 A)/PT (10 W-~200 W, 10 sccm-~200 sccm Ar, up to ~200 sec)/plasma nitridation (about 10 to about 300 W, about 10 to about 200 sccm Ar with about 0.01-~50 sccm $N_2$, 5 sec~1000 sec).

In summary, the use of plasma nitridation for the formation of the CCP insulating layer improves the purity of the Cu layer and of the neighboring magnetic layers, thereby offering the following advantages:

(a) Greater Cu purity.
(b) Prevention of associated magnetic layer oxidation.
(c) Improved dR/R.

What is claimed is:

1. A CCP CPP GMR device, comprising:
   a layer of copper on a magnetically pinned layer that is free of oxygen contamination;
   on said copper layer, an insulating layer of a metallic nitride having an upper surface;
   filaments of pure copper, extending from said copper layer through said insulating metallic nitride layer to said upper surface, serving thereby as a current confining layer;
   a magnetically free layer, that is free of oxygen contamination, on said first upper surface; and
   a top electrode on said free layer.

2. The CCP CPP GMR device described in claim 1 further comprising additional current confining layers, located between said copper layer and said magnetically free layer.

3. The CCP CPP GMR device described in claim 2 further comprising a copper layer between each of said additional current confining layers.

4. The CCP CPP GMR device described in claim 1 wherein each of said insulating metallic nitride layers is a nitride of a material selected from the group consisting of Al, Mg, Ti, Hf, Cr, Zr, Fe, Si and Ta.

5. The CCP CPP GMR device described in claim 1 wherein each of said insulating metallic nitride layers has a thickness in the range of from about 2 to 20 Angstroms.

* * * * *